PULSE RESHAPER EMPLOYING PLURALITY OF DELAY LINE UNITS INTERCONNECTED BY DIFFERENTIAL AMPLIFIER MEANS

Filed March 5, 1963 3 Sheets-Sheet 1

INVENTORS
Fujio Kobayashi
Kaname Sakai

By Paul M. Craig, Jr.
ATTORNEY

May 31, 1966 FUJIO KOBAYASHI ET AL 3,254,233

PULSE RESHAPER EMPLOYING PLURALITY OF DELAY LINE UNITS INTERCONNECTED BY DIFFERENTIAL AMPLIFIER MEANS

Filed March 5, 1963 3 Sheets-Sheet 2

INVENTORS
Fujio Kobayashi
Kaname Sakai
By Paul M. Craig, Jr.
ATTORNEY

PULSE RESHAPER EMPLOYING PLURALITY OF DELAY
LINE UNITS INTERCONNECTED BY
DIFFERENTIAL AMPLIFIER MEANS

Filed March 5, 1963 3 Sheets-Sheet 3

INVENTORS
Fujio Kobayashi
Kaname Sakai
By Paul M. Craig, Jr.
ATTORNEY

United States Patent Office 3,254,233

Patented May 31, 1966

3,254,233

PULSE RESHAPER EMPLOYING PLURALITY OF DELAY LINE UNITS INTERCONNECTED BY DIFFERENTIAL AMPLIFIER MEANS

Fujio Kobayashi and Kaname Sakai, Tokyo, Japan, assignors to Hitachi, Ltd., Tokyo, Japan, a corporation of Japan Filed Mar. 5, 1963, Ser. No. 262,879
Claims priority, application Japan, Mar. 7, 1962, 37/8,235
5 Claims. (Cl. 307—88.5)

The present invention relates to methods of reshaping pulses for use in pulse transmission lines including delay line registers and is primarily intended to overcome various difficulties encountered in conventional pulse-reshaping methods.

According to one aspect of the present invention, there is provided, in a pulse transmission system including a cascade connection of a plurality of current-switching amplifiers with circuit elements for pulse transmission interposed therebetween so that pulses are transmitted through the successive stages of amplification, a method of reshaping pulses comprising producing an inverted output at each stage of amplification and transmitting said output to the next stage of amplilcation.

According to another aspect of the present invention, there is provided a delay line register comprising a delay line divided into a plurality of delay line units, and a pair of current-switching amplifiers respectively arranged on the input and output sides of each of said delay line units in cascade connection for transmitting the inverted output of each of said amplifiers to the next stage.

The invention will now be more particularly described with reference to the accompanying drawings, in which:

FIGS. 1 and 3 are block diagrams illustrating two respective forms of delay line register;

FIG. 2 graphically illustrates the characteristics of a typical delay line;

Delay line registers as used in digital computers and the like necessitate pulse reshaping circuits for reshaping pulse signals heavily distorted while being transmitted through the delay line.

Figure 1:
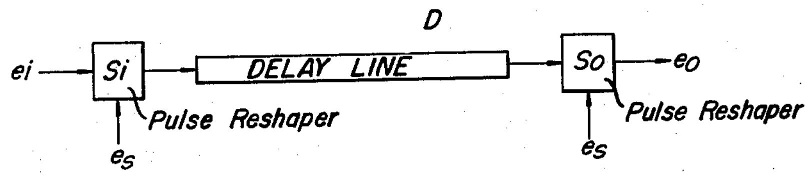

First, such pulse reshaping circuit will be explained for better understanding of the present invention. FIG. 1 illustrates one conventional form of delay line register, which includes a delay line *De* and pulse reshaping circuits *Si*, *So* operable by logical gating with clock pulse $e_s$. The input pulse $e_i$ is first retimed and reshaped by the input-side pulse reshaper *Si* with clock pulse $e_s$ fed therein, then delayed one or more word-times, and again retimed and reshaped by the output-side pulse reshaper *So* with clock pulse $e_s$ to obtain a delayed output signal $e_o$.

Figure 2:
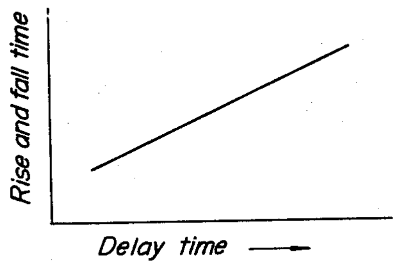

With such delay line register, the waveform distortion of a pulse signal during transmission through the delay line and the variation in the operating voltage level of the pulse reshapers have become important problems. As regards the waveform distortion in the delay line, the relationship between the delay time and the time of rise and fall is that as the delay time increases the time of rise and fall also increases as illustrated in FIG. 2, that is, the rise and fall time is approximately proportional to the delay time. This means that for a given delay time the waveform distortion grows heavier as the speed of pulse signal increases and that the longer the delay time required, the more extended delay line is required and with this the waveform distortion of the delayed output signal grows heavier. This forms a critical problem particularly in case the device is operated at higher speeds.

Figure 3:
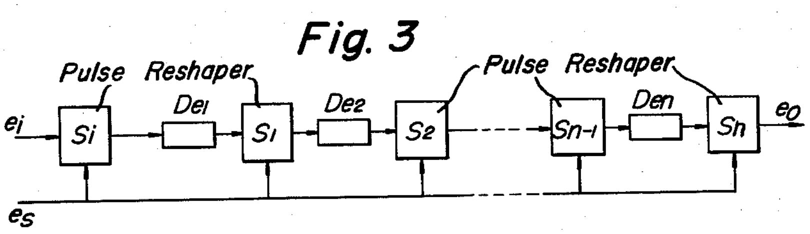

In order to minimize such waveform distortion deriving from the delay line, a divided system has been proposed in which the delay line is divided into a number of stages, $De_1$, $De_2$, . . ., $De_n$ with pulse reshapers $S_1$, $S_2$, . . ., $S_{n-1}$ interposed between the adjacent stages, as illustrated in FIG. 3. In the divided type register, the delay time required with each of the delay lines $De_1$, $De_2$, . . ., $De_n$ will be $1/n$ times that of the delay line *De* in the register of FIG. 1 for the same time delay requirement. This means that the degree of wave distortion at each stage is also reduced to $1/n$. Also, it will be understood that the cycle time variable range of clock pulses, keeping the system in correct operation, is increased $n$-fold. Assuming that $\Delta T_m$ represents the allowable time deviation in time position of the clock pulse as delayed a predetermined time by the undivided delay line and the deviation of the clock pulse for the same cycle time at each of the $n$ stages in the divided register will be represented by $$\frac{1}{n}\Delta T$$

A deviation of $\Delta T$ will take place at each stage only when the variation in the cycle time is increased $n$-fold. Thus, by doing this, the allowable margin for the cycle time variation may be increased. In this case, however, since each stage includes a pulse reshaper, the distortion due to the variation in the operating voltage level of such pulse reshaper (generally an increase or decrease of the pulse width) will be accumulated stage by stage to appear in the output as such. This means that the variation in the operating voltage level of a pulse reshaper forms a critical problem with the divided system though it has little influence when a single-stage delay line is used. Further consideration will be made below in this regard.

Figure 4:
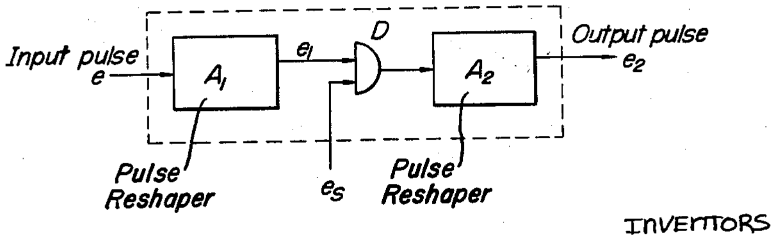
FIG. 4 is a block diagram of a conventional pulse reshaping circuit.
Figure 5:
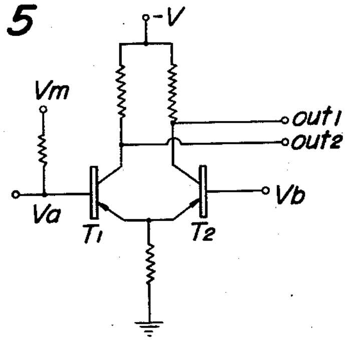
FIG. 5 illustrates a typical form of current-switching amplifier usable in pulse reshaping circuits.

FIG. 4 illustrates the arrangement of each of the pulse reshapers used in FIG. 3. The pulse reshaper shown includes current switching amplifiers $A_1$, $A_2$ and a re-timing AND gate D. The amplifiers $A_1$, $A_2$ are each of the so-called differential type essentially including two transistors $T_1$ and $T_2$, as shown in FIG. 5. In operation of this circuit, a comparison is made between the reference voltage $V_b$ impressed to the base of transistor $T_2$ and the base voltage $V_a$ of transistor $T_1$ in the manner well known in the art. As long as no input pulse is impressed to the base of transistor $T_1$, $V_b$ is greater than $V_a$. Under this condition, no output appears at the positive output terminal $out_1$, but a pulse signal is produced at the negative output terminal $out_2$. On the other hand, when an input pulse arrives at the base of transistor $T_1$ to obtain a state $V_b < V_a$, a pulse signal will appear at terminal $out_1$ but not $out_2$. A voltage source $V_m$ is provided to set up a pedestal level $V_o$, which corresponds to $V_a$ in normal state, i.e., when $V_b > V_a$.

Referring again to FIG. 4, the conventional current switching amplifier uses only the positive output terminal, therefore, input pulse $e$ entering the input terminal of current switching amplifier $A_1$ is reshaped and amplified therein to give a positive signal $e_1$, which is transmitted to the re-timing gate D. The output of the re-timing gate, which is synchronized with clock pulse $e_s$, is reshaped and amplified by amplifier $A_2$ to obtain a synchronized reshaped output pulse $e_2$ at the positive output terminal of the amplifier $A_2$.

Figure 6:
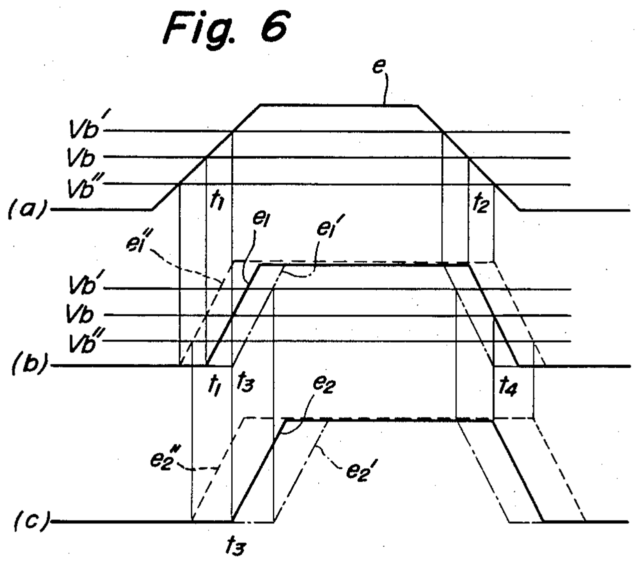
FIG. 6 is a diagram showing the waveform of a pulse signal changing with variation in the operating voltage level while passing through the pulse reshaping circuit of FIG. 4.

With this circuit, variations in the reference voltage $V_b$ in each current-switching amplifier and in the source $V_m$ for setting up pedestal level $V_o$ are called in question. Referring next to FIG. 6, which illustrates waveforms of (a) input pulse $e$, (b) positive output of amplifier $A_1$ and (c) positive output of amplifier $A_2$. As long as the reference voltage is held at its predetermined level, the output of amplifier $A_1$ will be a pulse $e_1$ (indicated by a thick line in FIG. 6, (b)) which rises at time $t_1$ when input pulse $e$ exceeds the $V_b$ level and falls at time $t_2$ when it is reduced below the $V_b$ level. Assume that the output pulse $e_1$ is applied intact to the second amplifier $A_2$ as its input. When the reference level $V_b$ has also its predetermined value, the positive level or output $e_2$ takes the form of a pulse $e_2$ having the waveform (c) in FIG. 6, which rises at $t_3$ when $e_1$ exceeds the $V_b$ level and falls at $t_4$ when $e_1$ decreases below $V_b$ level. If the $V_b$ level of both the amplifiers $A_1$ and $A_2$ is raised to $V_b'$, the output pulse of amplifier $A_1$ will be as indicated at $e_1'$ in FIG. 6, (b), for the same input signal $e$. The output pulse $e_1'$ is reduced in width compared with the normally obtained pulse $e_1$, as will be observed in the figure. Such pulse of reduced width is sent to the second amplifier $A_2$, which has now reference level $V_b'$ as distinct from previous level $V_b$, and the output of which takes the form of a pulse $e_2'$ (in (c) of FIG. 6), which has a width narrower than that of normal output $e_2$. In this case of two-stage amplification, the rate of reduction in pulse width at stage $A_2$, when the reference level $V_b$ is varied to $V_b'$, is twice that at stage $A_1$. Similarly, when the reference level $V_b$ is reduced to $V_b''$, the output pulses obtained at respective stages $A_1$ and $A_2$ are extended in width as indicated at $e_1''$ in FIG. 6, (b) and $e_2''$ in FIG. 6, (c), respectively. In this case, the rate of extension in pulse width at stage $A_2$ is also twice that at stage $A_1$.

As described above, any variation in the reference voltage $V_b$ (or in source voltage $V_m$ for setting up $V_o$, since the variation in $V_b$ is entirely relative to the variation in $V_m$) causes reduction or extension in width of the reshaped output pulse. Therefore, in the divided system including at each stage such a pulse reshaper, the reshaped pulse output of which is reduced or extended in width with variation in the operating level, a pulse reduced or extended in width at the first stage is again reduced or extended at the second stage. Such reduction or extension is repeated at the following stages to obtain at the output or final stage a pulse which has an extremely narrow or wide width compared with that of the input pulse entering the delay line register, since the reduction or extension in width is accumulated stage by stage. In case the pulse width is extended stage by stage, there is a danger that it may overlap the clock pulse of the next cycle. This necessitates reduction in the clock pulse cycle time when it is desired to raise the speed of operation. However, it is noted that such reduction is subject to heavy limitations and causes marked reduction in the reduced allowable margin of the clock pulse. Particularly, in case the pulse width is reduced, the allowable margin of the clock pulse is narrowed by the fact that the width of the logical product pulse output of the re-timing AND gate is also reduced.

In the foregoing description it has been assumed that reference voltage $V_b$ varies. However, the operation will be the same even if source voltage $V_m$ is assumed to vary since the variation of $V_m$ and that of $V_b$ are entirely relative to each other, as pointed out hereinbefore. The fact that such variation of $V_m$ is effective to reduce or extend the pulse width in the same manner as described, makes it necessary to narrow the variable range of voltage $V_m$ to an extreme extent to obtain a correct operation against the cycle time variation $\Delta T$, but such limiting range of voltage $V_m$ is extraordinarily difficult in practical use.

Description will next be made with reference to FIG. 8, which illustrates one constructional example of a circuit arrangement largely similar to the reshaping circuit of FIG. 4 and embodying the present invention. This circuit includes current-switching amplifiers $A_1$, $A_2$ similar to those in FIG. 4 and a re-timing gate D interposed between the two amplifiers.

In operation of this circuit, input signal $e$ is reshaped and amplified by amplifier $A_1$, the negative output $-e_1$ of which is directed to the re-timing gate D through terminal $out_2$ (FIG. 5). The output of the re-timing gate, being synchronized therein with the negative clock pulse $e_s'$, is again reshaped and amplified in amplifier $A_2$, from the negative output terminal of which a desired reshaped output $e_2$ is obtained.

Figure 7:
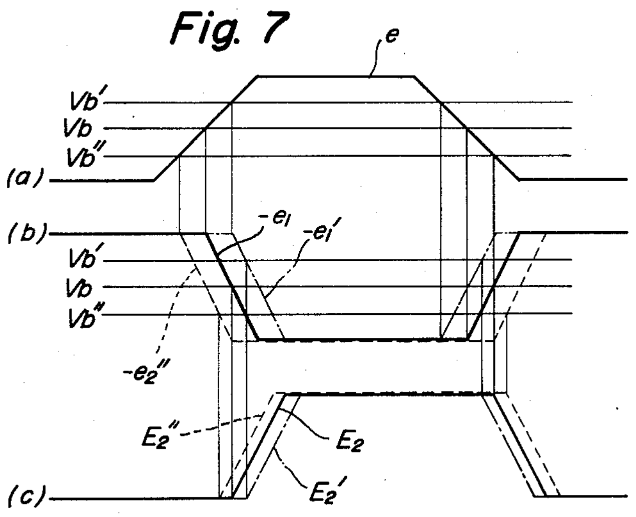
FIG. 7 is a diagram similar to FIG. 6 for the pulse reshaping circuit shown in FIG. 8.

With this arrangement, it is assumed that the source voltage $V_m$ (or the reference level $V_b$) of each of the amplifiers $A_1$ and $A_2$ varies as described hereinbefore in connection with the circuit of FIG. 4. The output of each amplifier will then have the waveform shown in FIG. 7. FIG. 7 illustrates an input pulse in (a), which is similar to one shown in FIG. 6, (a), the negative output signal of amplifier $A_1$ for such input pulse in (b), and the negative output signal of amplifier $A_2$ in (c), when the output of amplifier $A_1$ is led intact to enter the amplifier $A_2$.

As long as reference voltage $V_b$ or source voltage $V_m$ has a normal value, the negative output signal from $A_1$ is as indicated at $-e_1$ in FIG. 7, (b) and the negative output of $A_2$ is as indicated at $E_2$ in FIG. 7, (c) and identical with $e_2$ shown in FIG. 6, (c). In case reference voltage $V_b$ is varied to $V_b'$, the respective negative outputs of the amplifiers $A_1$ and $A_2$ will have waveforms $-e_1'$ and $E_2'$, respectively, shown in FIG. 7, (b) and (c). As observed, the negative output $E_2'$ has a pulse width extended relative to that of the corresponding output $e_2'$ shown in FIG. 6, (c) and is substantially equal to $E_2(=e_2)$. Contrariwise, in case $V_b$ is reduced to $V_b''$, the respective negative outputs of $A_1$ and $A_2$ will have waveforms $-e_1''$ and $E_2''$, respectively shown in FIG. 7, (b) and (c). The negative output $E_2''$ of $A_2$ has a width reduced relative to that of the corresponding output $e_2''$ shown in FIG. 6, (c) and substantially equal to $E_2$.

In this circuit arrangement embodying the present invention, when the source voltage $V_m$ (or reference voltage $V_b$) supplied to amplifiers $A_1$ and that supplied to amplifier $A_2$ vary as described above, i.e., at the same time and in the same direction, a negative output is led from amplifier $A_1$ and is again negated by amplifier $A_2$. The pulse signal once extended (or reduced) in $A_1$ is thus reduced (or extended) in $A_2$ for proper correction. Accordingly, when a pulse reshaping circuit as illustrated in FIG. 8 is used in FIG. 3 for each of pulse reshapers $S_i$, $S_1$, $S_2$, . . . $S_{n-1}$, $S_o$, an extraordinarily stable circuit operation can be expected compared with the case in which pulse reshapers each as shown in FIG. 4 are employed, since any variation in pulse width at each stage occurring due to variation in the operating voltage level is effectively corrected or compensated at the following stage or stages. The reference cycle time of clock pulses is usually kept fixed by a stable crystal oscillator of known construction. In practical use, then, the time deviation of cycle time is nearly zero. In this case, $\Delta T$ is equal to the time delay variation in the delay line and the pulse reshaper. In other words, the arrangement of the present invention gives to the source voltage $V_m$ a much wider variable range than that obtained with the circuit of FIG. 4.

Figure 8:
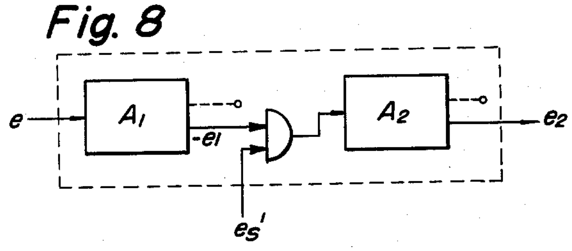
FIG. 8 is a block diagram of a pulse reshaping circuit embodying the present invention.
Figure 9:
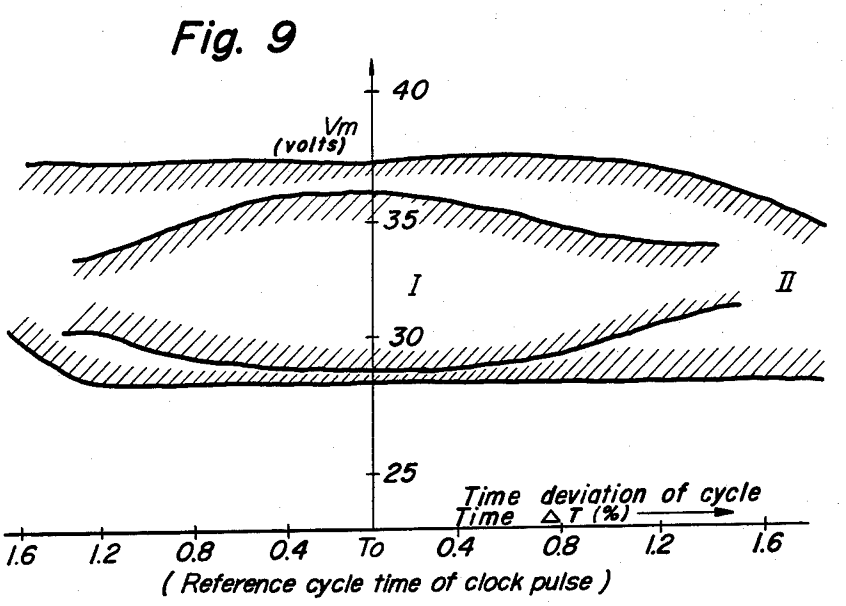
FIG. 9 represents the results of marginal checks conducted with the conventional and inventive delay line registers.

FIG. 9 represents the results of experiments conducted with divided type delay line registers of $n=2$ as shown in FIG. 3 for comparison between those employing conventional pulse reshapers as shown in FIG. 4 and those employing the circuit of FIG. 8 embodying the present invention. In FIG. 9, the abscissa gives the cycle time deviation $\Delta T$ from the reference $T_0$ in percentage, and the ordinate gives the voltage $V_m$. The region I is a range of correct operation obtained with conventional pulse reshapers and the region II is that obtained with pulse reshapers of the present invention. As is clearly observed, region II is much wider than region I.

It will be understood that the same correcting effect can be obtained with the above embodiment even when arranged so that the input pulse $e_1$ entering the first pulse reshaper $S_1$ is just inverted therein and the inverted output of the reshaper $S_1$ is transmitted through the delay line $De_1$ to the next pulse reshaper $S_1$ to be again inverted therein, such inversion being further repeated in the succeeding stages including the final one.

Though some forms of delay line register have been described and shown herein, it is to be understood that the reshaping method of the present invention is not to be limited to such registers but may also be advantageously applied to other various pulse transmission circuits. In such applications, synchronization may not always be required, and the logical gating circuit can thus be eliminated from between amplifiers $A_1$ and $A_2$. In some cases, a delay line or other circuit may be interposed between amplifiers $A_1$ and $A_2$ as desired. There is no intention of excluding such equivalents of the invention described or the portions thereof as fall within the purview of the claims.

What is claimed is:

1. A delay line register comprising a delay line divided into a plurality of delay line units, and delay combinations comprising differential amplifiers respectively connected to input and output sides of each of said delay line units, said delay combinations being connected in cascade for transmitting an inverted output of each of said amplifiers to a following amplifier.

2. A delay line register comprising a plurality of delay line combinations connected in series each including a delay line unit and differential amplifier means connected to input and output sides of said delay line unit, adjacent differential amplifier means being connected to one another between respective combinations so as to produce inversion of a transferred waveform between successive amplifier means.

3. A delay line register comprising an alternate arrangement of differential amplifier means and delay line units connected in series relationship, said differential amplifier means consisting of a pair of differential amplifiers each having an input and an output and being connected in series with gate means connected between that output of one of said differential amplifiers providing an inverted waveform and the input of the other differential amplifier that output of the other differential amplifier providing an inverted waveform being connected to a following delay line unit.

4. A delay line register comprising an alternate series arrangement of differential amplifier means and fractional delay line units interconnected thereby, each differential amplifier means including an input and an output and producing at least one inversion within said amplifier means of a waveform transferred between said input and said output.

5. A delay line register comprising an alternate series arrangement of differential amplifier means and fractional delay line units interconnected thereby, said differential amplifier means including a pair of series connected differential amplifiers, each producing an inversion of a transferred waveform between successive amplifiers.

References Cited by the Examiner

UNITED STATES PATENTS

| | | | |
|---|---|---|---|
| 2,647,998 | 8/1953 | Paxson | 328—55 X |
| 2,710,944 | 6/1955 | Bangert | 330—57 X |
| 2,875,336 | 2/1959 | Williams | 328—56 X |
| 3,080,531 | 3/1963 | Koppel et al. | 330—69 |
| 3,103,635 | 9/1963 | Campbell et al. | 330—16 X |

ARTHUR GAUSS, *Primary Examiner.*